United States Patent
Hines et al.

(10) Patent No.: US 9,030,652 B2
(45) Date of Patent: May 12, 2015

(54) NON-CONTACT, OPTICAL SENSOR FOR SYNCHRONIZING TO FREE ROTATING SAMPLE PLATENS WITH ASYMMETRY

(71) Applicant: k-Space Associates, Inc., Dexter, MI (US)

(72) Inventors: Scott Hines, Ypsilanti, MI (US); Darryl Barlett, Dexter, MI (US); Charles A. Taylor, II, Ann Arbor, MI (US); Greg DeMaggio, Ann Arbor, MI (US)

(73) Assignee: k-Space Associates, Inc., Dexter, MI (US)

( * ) Notice: Subject to any disclaimer, the term of this patent is extended or adjusted under 35 U.S.C. 154(b) by 297 days.

(21) Appl. No.: 13/691,829

(22) Filed: Dec. 2, 2012

(65) Prior Publication Data
US 2013/0141711 A1 Jun. 6, 2013

Related U.S. Application Data

(60) Provisional application No. 61/566,212, filed on Dec. 2, 2011.

(51) Int. Cl.
| | | |
|---|---|---|
| G01P 3/36 | (2006.01) |
| G01J 3/28 | (2006.01) |
| G01B 11/02 | (2006.01) |
| G01N 21/00 | (2006.01) |
| G01N 21/47 | (2006.01) |
| G01P 3/486 | (2006.01) |
| H01L 21/67 | (2006.01) |
| H01L 21/687 | (2006.01) |

(52) U.S. Cl.
CPC . *G01P 3/36* (2013.01); *G01P 3/486* (2013.01); *H01L 21/67253* (2013.01); *H01L 21/68764* (2013.01); *H01L 21/68771* (2013.01)

(58) Field of Classification Search
CPC ..... G01P 3/36; G01P 3/486; H01L 21/67253; H01L 21/6877; H01L 21/68764; G01J 3/28; G01B 11/02; G01N 21/47; G01N 21/00
USPC ............ 356/327, 28, 28.5, 326, 504, 72, 446, 356/477, 484
See application file for complete search history.

(56) References Cited

U.S. PATENT DOCUMENTS

| | | | | |
|---|---|---|---|---|
| 4,385,238 A * | 5/1983 | Westerberg et al. | ........ | 250/491.1 |
| 4,878,736 A * | 11/1989 | Hekker et al. | ................ | 359/561 |
| 4,922,336 A * | 5/1990 | Morton | ........................ | 348/51 |
| 5,138,564 A * | 8/1992 | de Jong et al. | ................ | 702/96 |
| 6,349,270 B1 * | 2/2002 | Gurary et al. | ................ | 702/134 |
| 7,008,802 B2 * | 3/2006 | Lu | ..................... | 438/7 |
| 7,275,861 B2 * | 10/2007 | Volf et al. | ........................ | 374/1 |

(Continued)

*Primary Examiner* — Luke Ratcliffe
*Assistant Examiner* — Assres H Woldemaryam
(74) *Attorney, Agent, or Firm* — Endurance Law Group, PLC

(57) ABSTRACT

A method and apparatus for determining the synchronicity of a rotary platen (22) in a vacuum deposition chamber (24). A light source (64) projects a highly collimated light beam (66) onto the rotating platen (22), thereby tracing a circular swept path (67). The swept path (67) passes alternately through samples (20) on the platen (22) and intervening webs (58, 60). The samples (20) are significantly more reflective than the webs (58, 60). The platen (22) includes an asymmetry feature (60) along the swept path (67). A detector (62) measures light signals reflected from the platen (22) along the swept path (67), and generates a unique signal upon encountering the asymmetry feature (60). A microcontroller generates a trigger pulse synchronized to the unique signal.

11 Claims, 7 Drawing Sheets

(56) References Cited

U.S. PATENT DOCUMENTS

| | | | |
|---|---|---|---|
| 7,391,009 B2 * | 6/2008 | Feurer | 250/231.14 |
| 7,452,125 B2 | 11/2008 | Volf et al. | |
| 7,570,368 B2 * | 8/2009 | Belousov et al. | 356/601 |
| 7,662,649 B2 * | 2/2010 | Blomiley et al. | 438/16 |
| 7,840,372 B2 * | 11/2010 | Lu | 702/151 |
| 8,022,372 B2 * | 9/2011 | Lee et al. | 250/458.1 |
| 8,198,605 B2 | 6/2012 | Lee et al. | |
| 8,202,738 B2 * | 6/2012 | David et al. | 438/7 |
| 8,786,841 B2 * | 7/2014 | Barlett et al. | 356/72 |
| 2003/0045008 A1 * | 3/2003 | Olsen et al. | 438/7 |
| 2005/0106876 A1 * | 5/2005 | Taylor et al. | 438/689 |
| 2008/0003702 A1 * | 1/2008 | Cruse et al. | 438/7 |
| 2009/0095814 A1 * | 4/2009 | Haggerty et al. | 235/462.32 |
| 2010/0246631 A1 * | 9/2010 | Barlett et al. | 374/2 |
| 2011/0297076 A1 | 12/2011 | Lee et al. | |

* cited by examiner

NON-CONTACT, OPTICAL SENSOR FOR SYNCHRONIZING TO FREE ROTATING SAMPLE PLATENS WITH ASYMMETRY

CROSS REFERENCE TO RELATED APPLICATIONS

This application claims priority to Provisional Patent Application No. 61/566,212 filed Dec. 2, 2011, the entire disclosure of which is hereby incorporated by reference and relied upon.

BACKGROUND OF THE INVENTION

1. Field of the Invention

This invention relates to non-contact, in-situ diagnostics used to monitor various thin film growth parameters during multi-sample deposition on high speed rotation stages.

2. Related Art

Essential components for electronic and optoelectronic devices, such as integrated circuits, chips, processors, LEDs, lasers, transistors and solar cells, are made by depositing or growing very thin layers of atoms onto a semiconductor (or other material type) wafer substrate. During the thin film deposition/growth process, a batch of wafer substrates are heated from behind and rotated about a center axis in a vacuum environment. Direct benefits in end component quality and performance can be achieved by precisely controlling growth process properties like temperature and film thickness with high precision and repeatability.

Numerous methods have been disclosed for monitoring process temperatures and film thicknesses. These include precise and real-time monitoring of the substrate temperature or property. The BandiT™ system from k-Space Associates, Inc., Dexter Mich., USA (kSA), assignee of the subject invention, has emerged as a premier, state-of-the-art method and apparatus for measuring semiconductor substrate temperature. The kSA BandiT system is described in detail in US Publication No. 2005/0106876 and U.S. Publication No. 2009/0177432 the entire disclosures of which are incorporated hereby reference.

In addition to the use of sophisticated monitoring systems, the production of high-quality semiconductor products can be improved still further with advances in the deposition systems themselves that are used to create the formation of semiconductor nanostructures. In particular, in deposition systems that utilize a multi-wafer rotary platen, opportunities for improvement are manifest. Many such deposition systems lack a positive mechanical lock between the motor driven spindle and the platen, usually as a result of certain structural constraints or methods of sample transfer within those particular systems. Operative connection between the motor drive spindle and platen may be in the form of a magnetic or friction coupling rather than meshing gears or toothed belts. In these cases, the phase angle of the platen may over time drift from the initial spindle arbor phase angle, making the standard spindle arbor "home pulse" signal useless for synchronization. Or, the slippage may be more or less continuous such that the spindle drive system indicates a rotary speed of 1500 RPM for example, but in fact the platen is only spinning at 1480 RPM.

Such systems lack real-time synchronization between the diagnostic device(s), e.g., a temperature monitoring systems like the kSA BandiT and/or a film thickness measurement system, with the war samples in a multiple sample platen. This lack of synchronization can be more problematic in high speed spindle configurations, where rotation speeds above 1,000 RPM are not uncommon. Typically, in multiple sample platen deposition systems, the diagnostic device must spend many rotations to diagnose the locations of each measurement after they occurred, making real-time monitoring and eventual control impossible.

There is therefore a need for a system and method to overcome asymmetry issues with respect to platen and drive spindle for the purposes of improving quality and performance during the thin film growth process.

SUMMARY OF THE INVENTION

According to a first aspect of this invention, an apparatus for determining the synchronicity of a rotary platen in a vacuum deposition chamber is provided. The apparatus includes a vacuum deposition chamber, and a platen supported for rotation about a center axis in the vacuum deposition chamber. The platen is configured to emit light signals about a circular swept path centered about the central axis. The platen includes an asymmetry feature along the swept path. The asymmetry feature has a unique signature with respect to other light signals emitted from the platen along the swept path. The apparatus also includes a rotary spindle drive, and a non-positive coupling operatively connecting the spindle drive to the platen for forcibly rotating the platen about the center axis. A detector is fixed relative to the rotating platen for measuring light signals emitted from the platen along the swept path. The detector is configured to generate a unique signal in direct response to the unique signature emitted by the asymmetry feature.

According to a second aspect of this invention, the apparatus includes a light source for projecting a light beam onto a rotating platen so as to trace a circular swept path of light on the platen as the platen rotates about a center axis. A detector is provided for measuring light signals reflected from the platen along the swept path. The detector is configured to generate a unique signal in direct response to encountering a unique signature in the light signals reflected from the rotating platen, the unique feature corresponding to an asymmetry feature of the platen. A microcontroller includes a non-transitory computer readable medium coded with instructions and executed by a processor to generate a trigger pulse synchronized to the unique signal. The frequency of two successive trigger pulses directly corresponds to the real-time rotational speed of the platen.

According to a third aspect of this invention, a method is provided for determining the synchronicity of a rotary platen in a vacuum deposition chamber. The method comprises the steps of rotating a platen about a center axis in a vacuum deposition chamber, projecting a light beam onto the rotating platen so as to trace a circular swept path of light on the platen as the platen rotates about the center axis, measuring light signals reflected from the platen along the swept path, identifying a unique signal in direct response to encountering a unique signature in the light signals reflected from the rotating, the unique feature corresponding to an asymmetry feature of the platen, and generating a trigger pulse in response to each identification of the unique signal, the frequency of the trigger pulse being directly proportional to the real-time rotational speed of the platen.

This invention enables real-time synchronization of the diagnostic system with a multiple sample platen, especially useful in applications where the platen is not mechanically locked to the drive spindle. The invention transmits a trigger pulse signal upon detection of one particular asymmetry on the platen surface, using light either emitted or reflected from the surface features of the platen and the samples. The invention can be constructed so that the physical light source and detection equipment resides outside the vacuum enclosure, with light signals passing through an optical port of the chamber, to provide real-time platen rotational data.

BRIEF DESCRIPTION OF THE DRAWINGS

These and other features and advantages of the present invention, will become more readily appreciated when considered in connection with the following detailed description and appended drawings, wherein.

DETAILED DESCRIPTION OF THE PREFERRED EMBODIMENT

Figure 1:
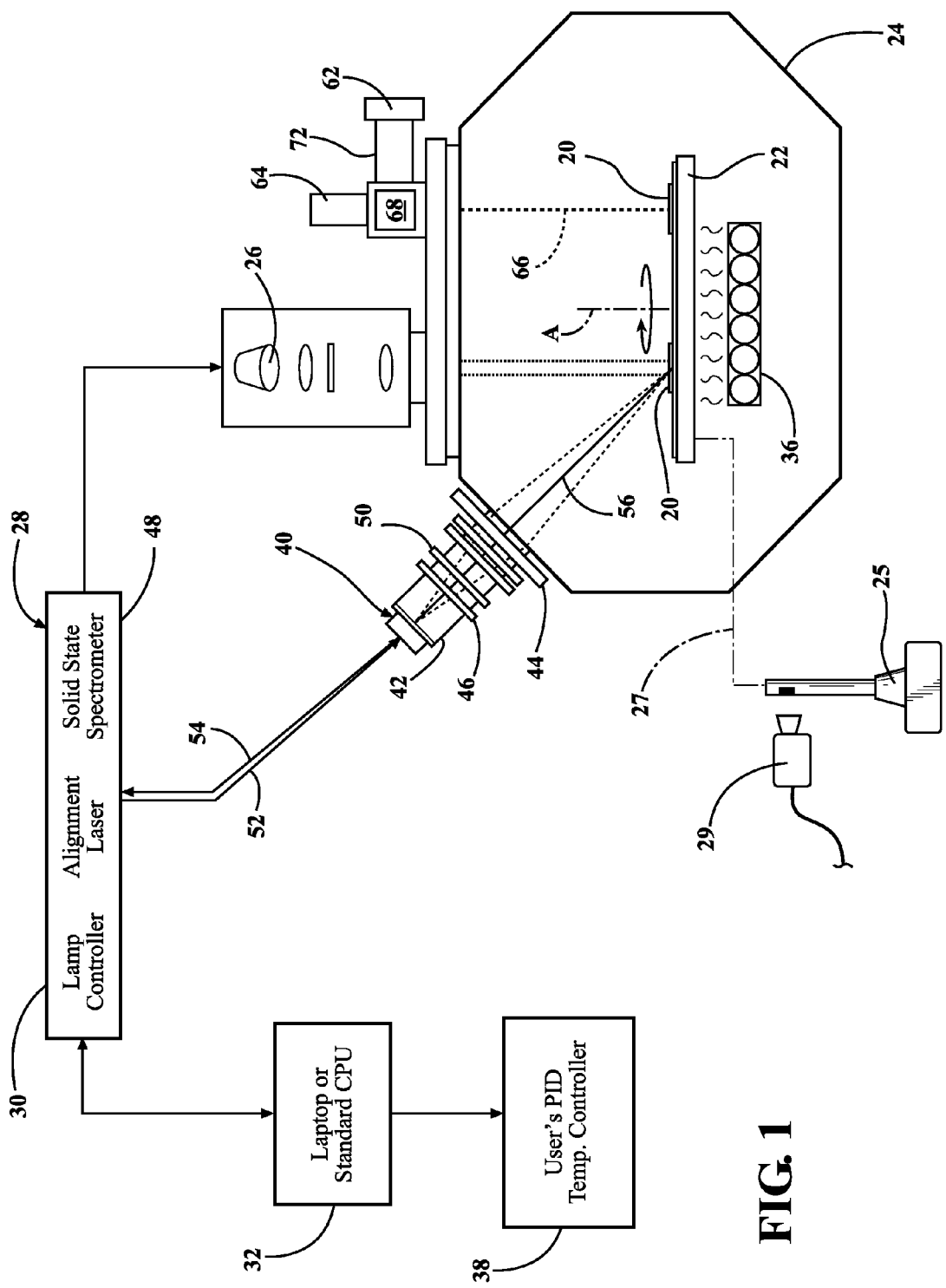
FIG. 1 is a schematic view of an exemplary thin film deposition process including an apparatus for determining the synchronicity of a rotary platen in a vacuum deposition chamber according to an embodiment of the invention.

Referring to the Figures, wherein like numerals indicate like or corresponding parts throughout the several views, an exemplary application of the method, apparatus, and system for achieving real-time synchronization of a diagnostic system to a multiple sample rotating platen is illustrated schematically in FIG. 1 within the context of a thin film deposition process. A semiconductor film is deposited or otherwise grown on a substrate (collectively a sample 20) supported on a rotating carrier or platen 22 within a vacuum deposition chamber 24, as shown in FIG. 1. The substrate may take the form of a disc-like wafer made of any suitable material, such as a silicon or sapphire composition, and the film of any suitable material, for example a semiconductor like Silicon (Si), GaN (Gallium Nitride), Gallium Arsenide (GaAs), and Indium Phosphide (InP), just to name a few. The system typically includes a depositor or a means for depositing the film on the substrate in a highly precise and controlled fashion. The means for depositing the film on the substrate can include any suitable technique including, by way of examples, a chemical vapor deposition process such as metalorganic vapor phase epitaxy (MOVPE), a molecular deposition process such as molecular beam epitaxy (MBE), or other thin-film deposition process including sputtering and the like.

The platen 22 is rotated about a center axis A inside the chamber 24 by a spindle drive 25. A coupling 27 operatively connects the spindle drive 25 to the platen 22. The invention is particularly adapted for deposition systems in which the platen 22 is not positively mechanically locked to its drive spindle 25 through the coupling 27. That is, the coupling 27 may be in the form of a magnetic or friction or fluid coupling, or some other construction, where the rotation of the platen 22 is not positively linked to the rotation of the spindle drive 25 (as compared to geared and toothed coupling arrangements that do provide a positive link). In non-positively coupled 27 drive systems 25, there exists opportunity for slippage between the platen 22 and drive spindle 25. In these instances, the standard spindle arbor "home pulse" signal captured by a spindle detector 29 will be useless for synchronizing the true angular position of the platen 22. For the instantaneous angular position of the platen 22, the lack of synchronicity makes the standard spindle arbor "home pulse" signal unreliable. When slippage occurs in operation, the lack of synchronicity means that the real-time platen 22 rotation speed slower that that indicated by measurements based on the spindle detector 29.

The deposition system preferably includes one or more features for determining meaningful properties of the sample 20, and which depend on precise synchronicity between drive 25 and platen 22. For purposes of example, the features may include devices for real-time monitoring process temperatures and film thicknesses. Taking only the example of temperature assessment, real-time monitoring may be accomplished with a unit like the BandiT™ system from k-Space Associates, Inc., Dexter Mich., USA (kSA). The system of FIG. 1 includes a light source 26 for interacting light with the sample 20 to produce diffusely scattered light. The light source 26 is typically a quartz halogen lamp mounted outside the deposition chamber 24 that directs light toward the sample 20. The light provided by the light source 26 is both visible and not visible to the naked eye. A control unit 28 containing a lamp controller unit 30 is connected to the light source 26 by a light source power cable. A computer 32, such as a laptop or standard central processing unit, employing a suitably configured software program, simultaneously monitors and operates the lamp controller unit 30 and other components of the system. The computer 32 is connected to the control unit 28 by a USB cable 34.

In the exemplary application of FIG. 1, the deposition system includes a heat source 36, which heats the samples 20 from behind. In an alternative configuration, the light source 26 and the heat source 36 may be integrated into the same component. The temperature of the sample 20 is monitored and controlled as variations in temperature ultimately affect quality and composition of the film deposited on the substrate. The system includes a temperature control 38, such as a PID temperature control 38, which is connected to the computer 32 and can be manually operated by a user of the system.

Light diffusely scattered from the sample 20 is analyzed to determine the optical absorption edge wavelength of the sample 20, which is used to calculate or determine by look-up the temperature or other properties of the sample 20. The optical absorption edge can also be referred to as the band edge or band gap. The system includes a detector 40 for collecting diffusely scattered light from the film 20. The detector 40 is typically a Si-based detector 40. The detector 40 includes a housing 42, which is also mounted outside the deposition chamber 24 proximate to a transparent view port at an angle that is non-specular to the light source 26. The detector 40 includes an adjustable tilt mount 44 comprising a micrometer-actuated, single-axis tilt mechanism built into the front of the detector 40 to assist in pointing the detector 40 at the sample within the chamber 24. The detector 40 also includes focusing optics 46 assisting in the collection of the diffusely scattered light.

The exemplary system includes a spectrometer 48, such as a solid state spectrometer 48 or an array spectrometer 48, for producing a spectra from or based on the diffusely scattered light from the film and collected by the detector 40. The optical absorption edge wavelength of the film is determined based on the spectra. The step of determining the optical absorption edge wavelength of the film based on the spectra includes accounting for the semiconductor material and the thickness of the film.

The exemplary system further includes an optical fiber unit 50, including a first optical fiber 52 coupled to the spectrometer 48 and a second optical fiber 54 running co-linear to first optical fiber 52 and coupled to a visible alignment laser 56 for aid in alignment of the detector 40. The optical components are optimized, using appropriate optical coatings, for either infrared or visible operation depending on the characteristics of the sample 20 being measured. The computer 32 is connected to the alignment laser 56 and the spectrometer 48 by the USB cable 34. The software program is employed to control the alignment laser 56 and spectrometer 48.

Less than optimal measurement/monitoring data may be experienced if the rotating platen 22 falls out of synchronicity with the drive spindle 25. This type of problem usually does not occur when the platen 22 and drive spindle 25 are mechanically linked through gears or belts. However, when they are not mechanically linked as in some drive system configurations, a loss of synchronicity can appear and even grow over time. When this happens, devices that measure and monitor relevant film growth characteristics can report less than accurate data, and result in less than ideal real-time thin film deposition information.

The present invention overcomes this deficiency by calibrating the angular position of the platen 22 at regular intervals, such as once each revolution. The invention accomplishes this goal by identifying a particular asymmetry on the platen 22 surface as a reference point, and then transmitting a "home pulse" signal at each encounter of the reference point. A particularly novel aspect of this invention is that light is used to generate the home pulse signal. The light used may either be emitted or reflected from the platen 22 and/or the samples 20.

This invention takes advantage of the naturally large differences in reflectivity between the samples 20 and the areas of platen 22 adjacent to the samples 20. These areas resemble radial spokes hereafter referred to as webs 58, 60. The sides of each web 58, 60 have opposing concave profiles formed by opposing circular segments of two adjacent samples 20. The narrowest portion of the webs 58, i.e., the narrowest spacing between adjacent samples 20, is labeled "X" in one representative web 58 location shown in FIG. 2. The narrowest spacing X occurs only at narrow webs 58, which comprise all of the webs 58 except the one web 60. Platens 22 used in many commercially available deposition systems are designed to receive samples 20 arranged in a predetermined pattern such that one of the webs 60 is wider than the other narrow webs 58. The single wide web 60 may be used by the present invention as a distinctive point of reference on the platen 22. The width of the wide web 60 is labeled "Y" in FIG. 2. The incident light intensity changes dramatically at these web 58, 60 locations, relative to the high reflectivity of the samples 20, as the platen 22 spins.

A microcontroller, which may be incorporated into the control unit 28 or as a stand-alone component, digitizes the voltage generated from a silicon detector 62, and then runs an analysis to determine the location of the asymmetry. The microcontroller includes a non-transitory computer readable medium coded with instructions and executed by a processor to perform the steps described below. At each encounter of the asymmetry, the microcontroller transmits a 5 micro-second trigger pulse at the trailing edge of the asymmetry. Suitable programming within the microcontroller can compensate for varying rotation rates and changing reflectivity conditions. Details of one exemplary algorithm to determine the position of the asymmetry will be described in detail below, however those of skill in the art may envision other techniques to achieve the same end effects and based upon the same core concepts of this invention.

Figure 2:
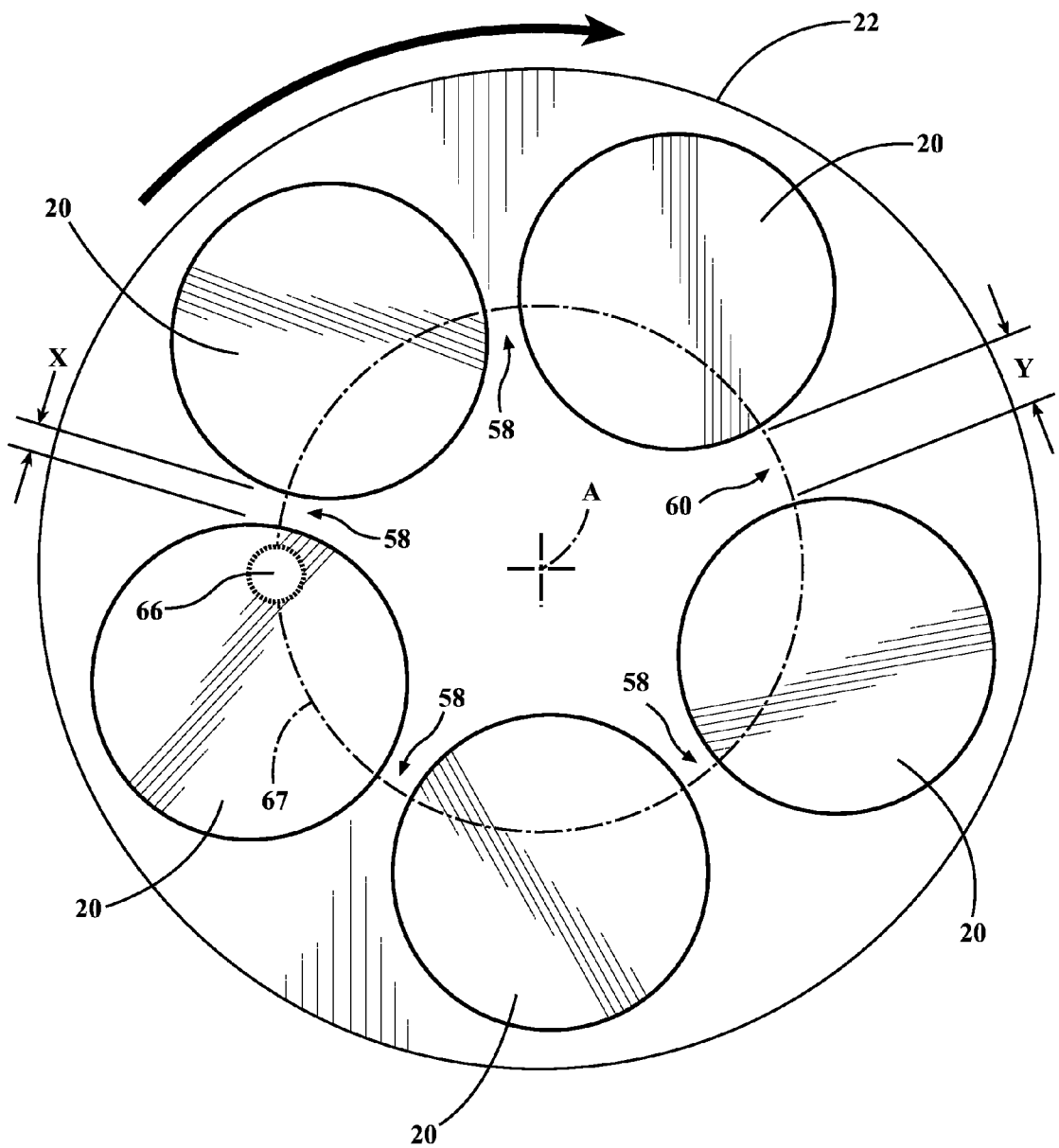
FIG. 2 is a simplified top view of a platen having a sample spacing asymmetry feature.
Figure 3:
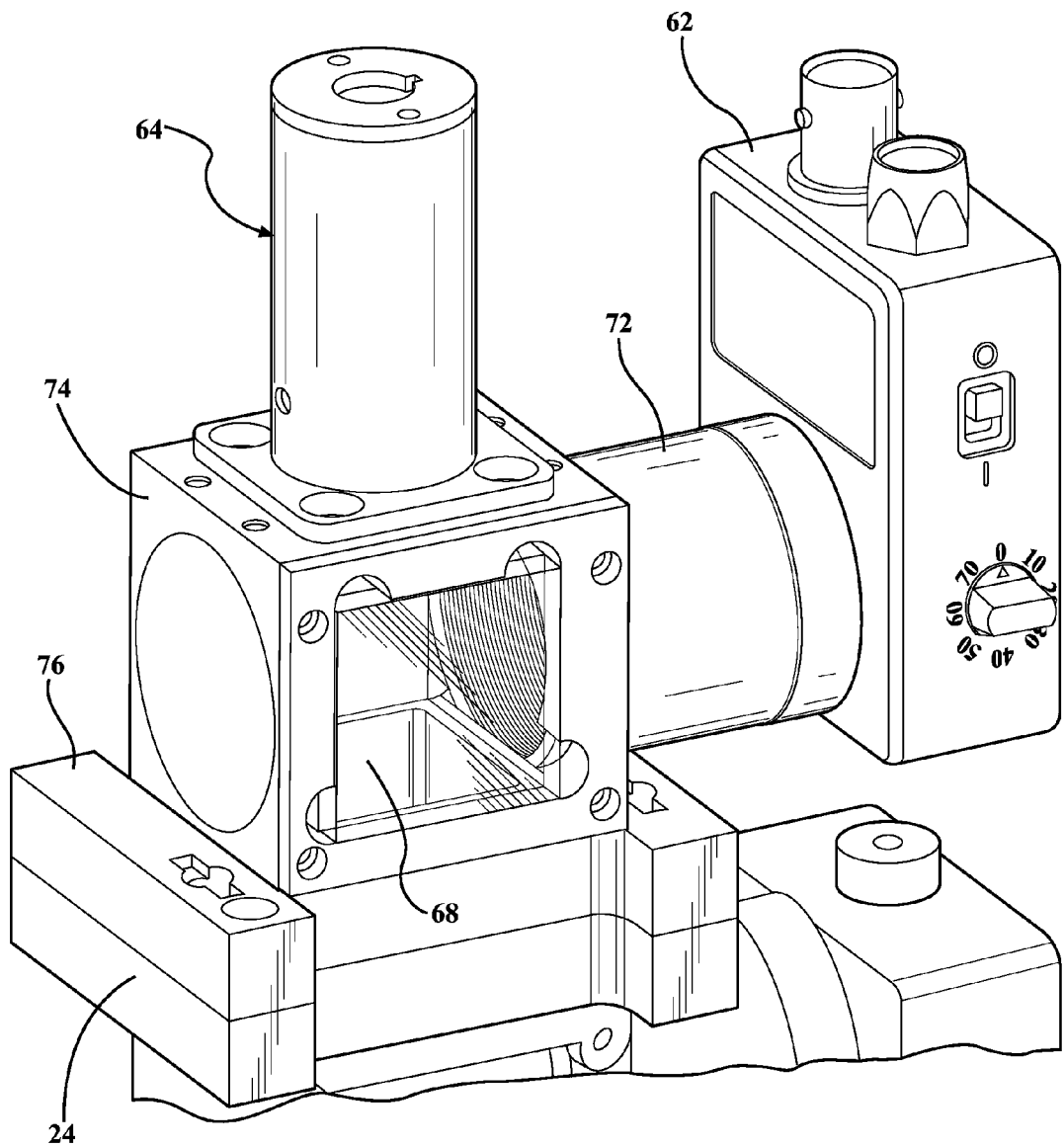
FIG. 3 is a perspective view of a reflectance assembly according to an embodiment of the invention.

Referring now to FIG. 3, one embodiment of the invention utilizes a highly collimated light source, generally indicated at 64, such as a low power CW laser directed at normal incidence to the surface of the platen 22. The laser beam produced by the light source 64 is indicated by broken line 66 in FIG. 1. The transitory spot at which the laser beam 66 strikes the platen 22, as well as its circular swept path 67 traced around the platen 22, is shown in FIG. 2. The position of the light source 64 is arranged so that the swept path 67 passes through the samples 20 and the intervening webs 58, 60. The portion of the swept path 67 that crosses any web 58, 60 is identified as a web segment. Each web segment has a length, with the length of the web segments for the narrow webs 58 being generally equal and shorter than the length of the web segment for the one wide web 60. Preferably, the web segments all coincide with the narrowest spacings X, Y of the respective webs 58, 60. However, in an alternative arrangement the web segments could be offset from the actual narrowest spacings X, Y, provided they all pass through some portion of the webs 58, 60 and samples 20 at an equal radial measure from the central axis A. In other words, the swept path 67 must pass alternately through webs 58, 60 and samples 20 so that the large differences in reflectivity can be used to indicate the periodic occurrence of the asymmetric wide web 60.

A beam splitter 68 redirects the reflected light through a narrow band pass optical filter 70 to focus on the solid state silicon detector 62. The optical filter 70 ensures that stray light from other sources as well as emitted light (i.e., black body radiation) from a hot platen 22 does not interfere with the reflected signal. The entire assembly may be integrated into a single housing, allowing for fine angle adjustments to compensate for any tilt between platen 22 and exterior support fixtures.

The light source 64 may be a simple 660 nm diode laser with integrated collimation/focusing lens housed within the cylinder block at the top. The laser wavelength & filter are chosen to yield best sensitivity depending on the sample 20 and platen 22 materials. The beam splitter cube 68 is fixed within a central mounting block 74 which also acts as beam stop as a safety to prevent stray laser light from escaping. The silicon detector 62 is mounted to a cylindrical lens holder 72 which houses the focusing lens and optical filter specific to the particular laser wavelength. The mounting block 74 for the assembly is preferably on a spring loaded fine adjustment mounting plate 76 to allow correction for any tilt (i.e., deviation from parallel) between the platen 2 and the mounting block 74 exterior to the chamber 24.

Figure 4:
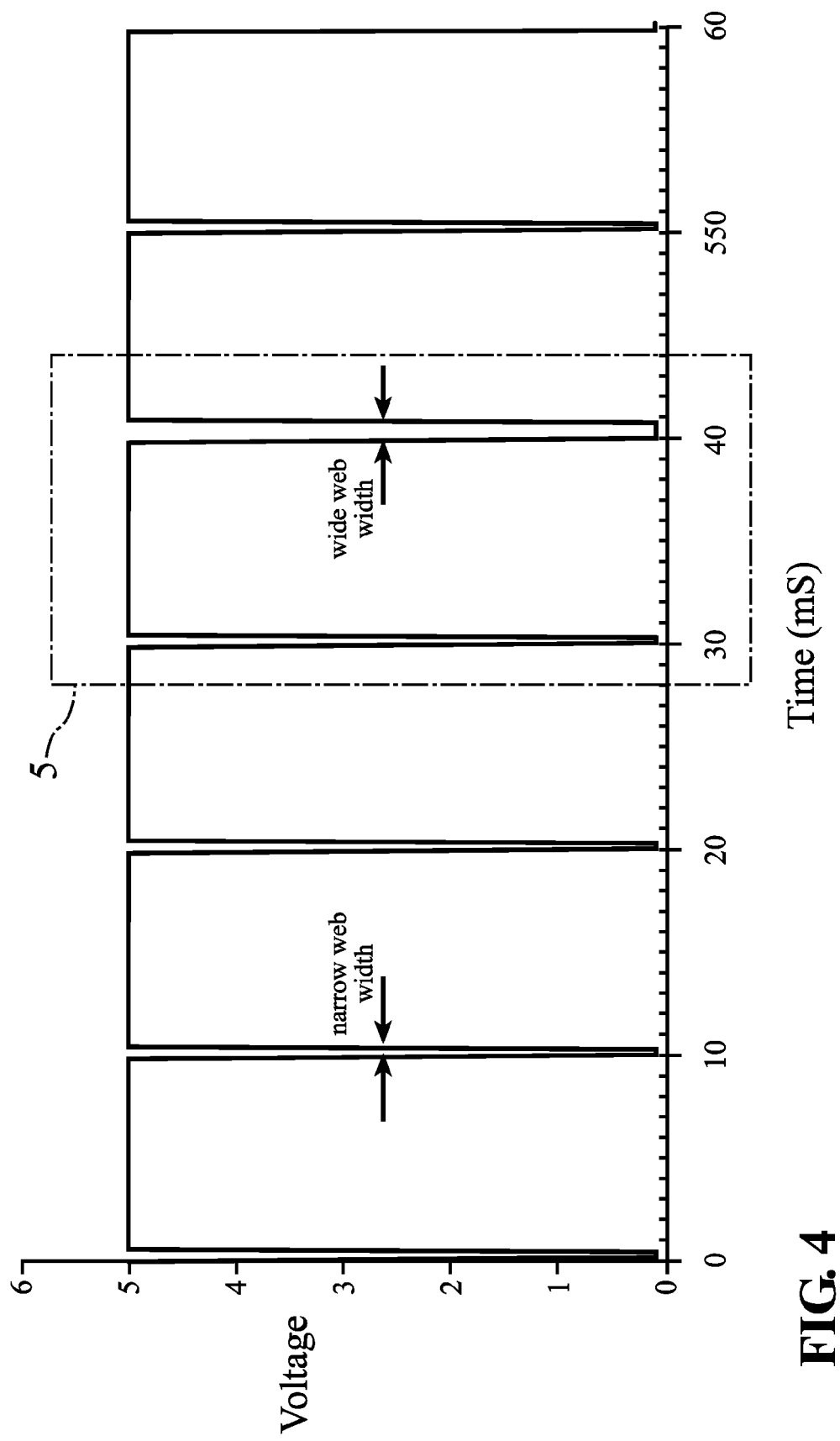
FIG. 4 is a graph showing the detector voltage output displaying a typical pulse train from the reflectivity of a spinning asymmetric platen.

The silicon detector 62 preferably has an integrated amplifier with adjustable gain so that the reflection signal can be set to saturate at the higher reflectivity sample 20 surfaces and there is sufficient voltage range between the samples 20 and the platen webs 58, 60. The output is sent directly to an analog input to the microcontroller for analysis of the output pulses. A sample output is graphically depicted in FIG. 4, and an enlarged view of the relevant region of the output is shown in FIG. 5.

Figure 6:
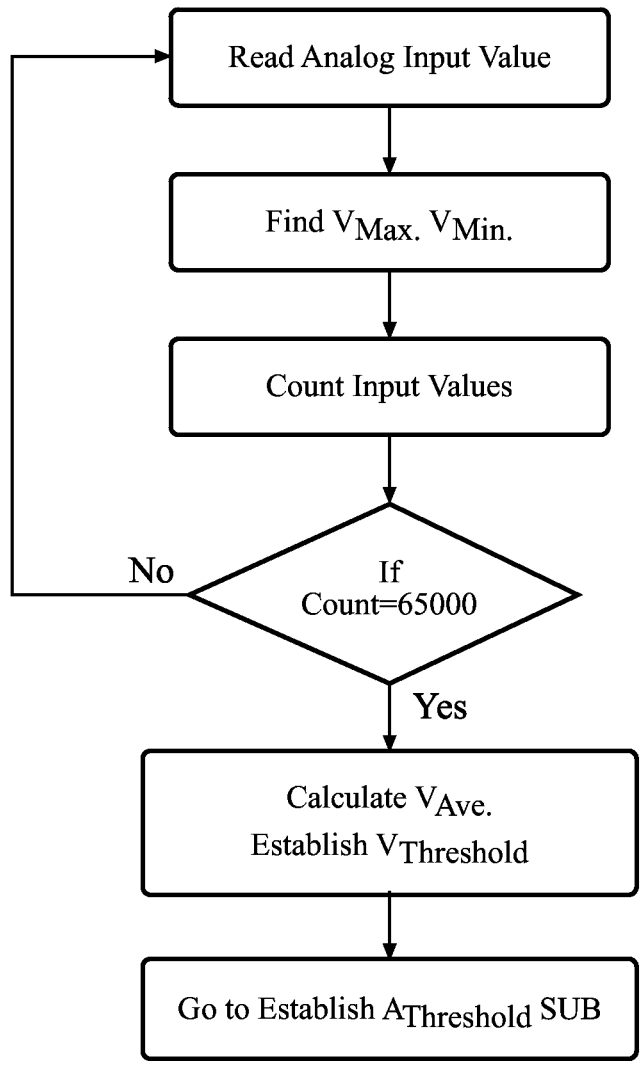
FIG. 6 is a flow chart describing the steps of the present invention as used to set a $V_{Threshold}$ value.
Figure 7:
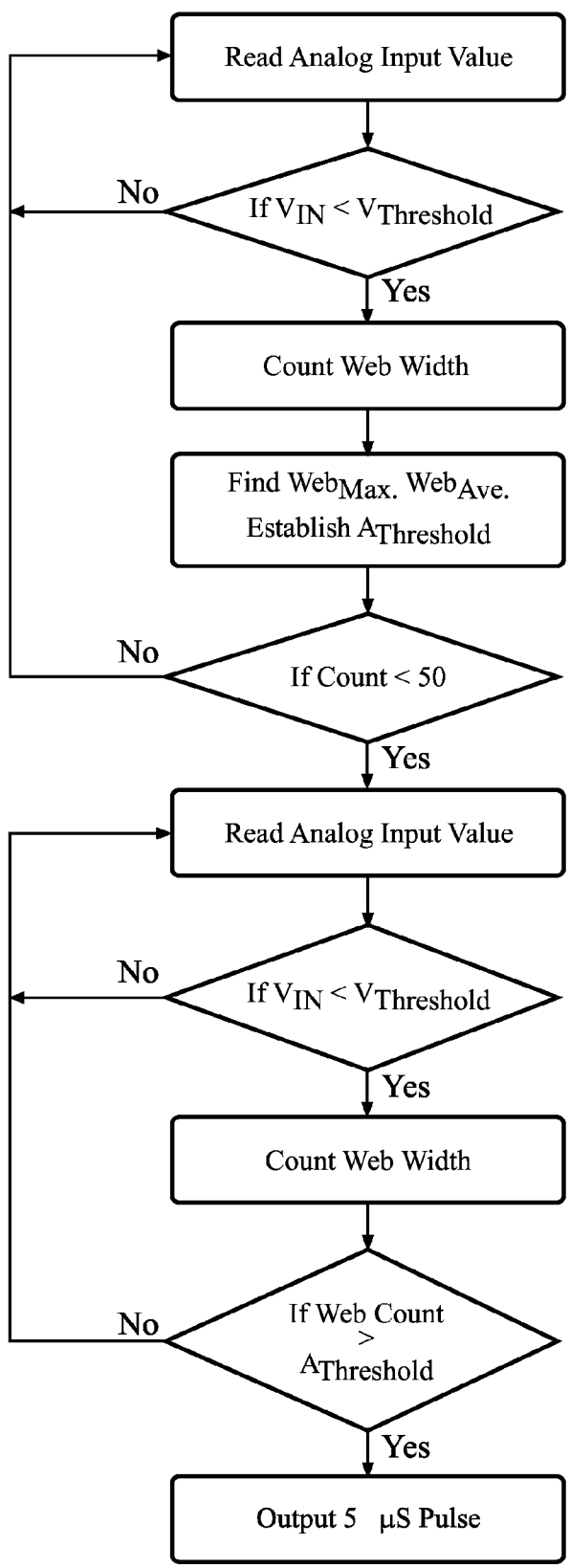
FIG. 7 is a flow chart describing the steps of the present invention as used to set an $A_{Threshold}$ value and an Output Pulse.

FIGS. 6 and 7 are flow charts describing the basic sequence of microcontroller operations. In particular, FIG. 6 lays out basic steps to set the $V_{Threshold}$ value, whereas FIG. 7 lays out basic steps to set the $A_{Threshold}$ value and the Output Pulse, as described more fully below.

In a preferred implementation, the microprocessor runs at an internal clock speed that is fast enough to poll the detector 62 signal with enough resolution to divide the reflectance from a full platen 22 rotation into at least 1600 points at rotation speeds of 1500 rpm. This is not intended as a limitation of present microcontrollers, but is deemed generally sufficient for the rotation speeds and platen 22 constructions predominant in the current population. Naturally, these exemplary specifications can be increased for higher speeds and other platen 22 designs. Also, as microprocessor performance increases with advances in technology, the ability to operate at even higher resolution, higher speeds and smaller platen 22 features will be possible. Other limitations would be the silicon detector 62 response time, which if needed could be overcome with an increase in laser 64 power.

Figure 5:
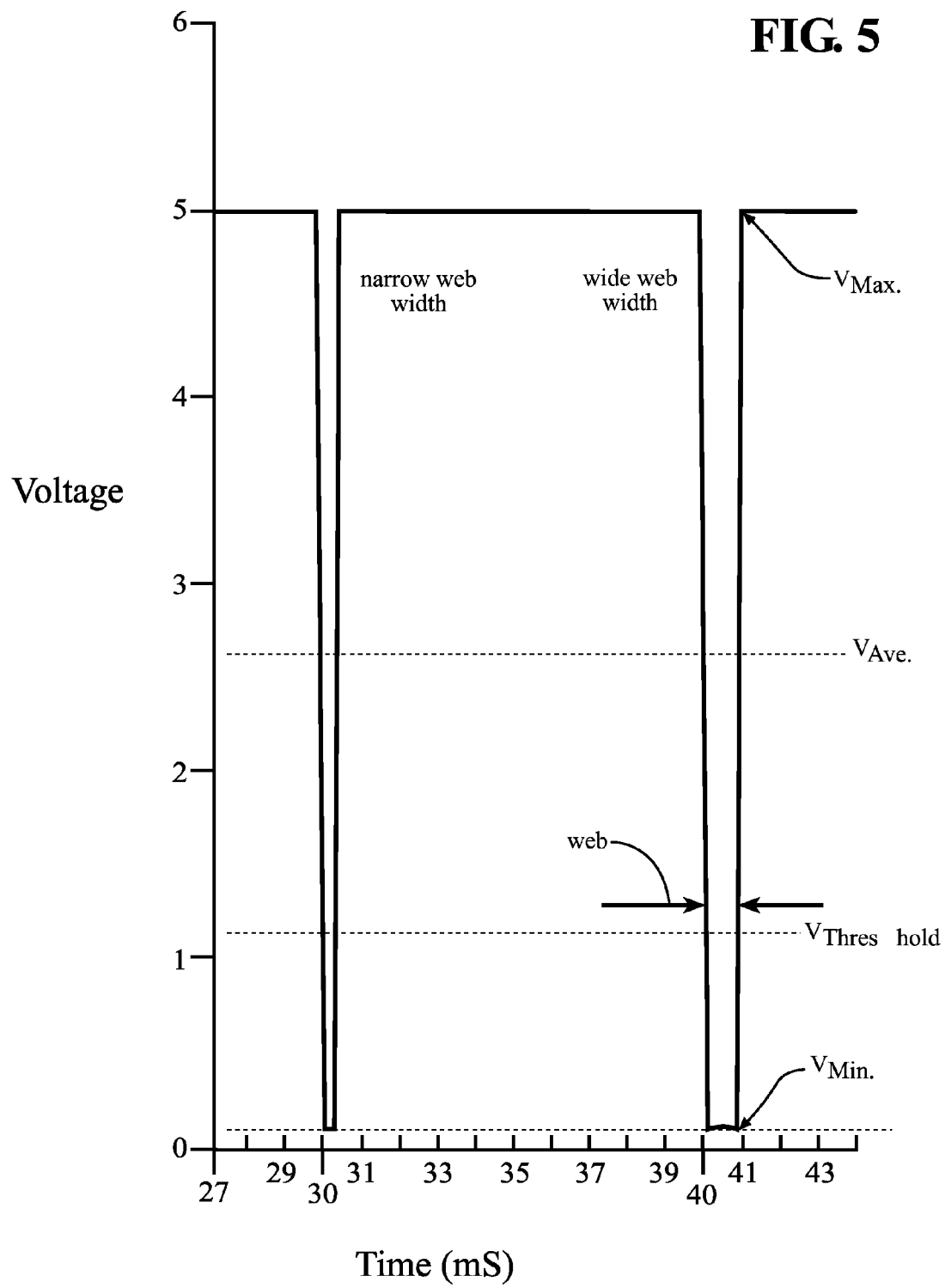
FIG. 5 in an enlarged view of the reflectance detector output indicated at 5 in FIG. 4.

In the initial voltage measurements, the microcontroller establishes a value for the maximum and minimum voltages, labeled $V_{Max}$ and $V_{Min}$ in FIG. 5. This is made over an average of 65,000 samples, or approximately 40 rotations at 1500 rpm (~1.6 seconds in real time). These values are updated on that time frame in order to track changes in reflectivity that will occur during film growth on both samples 20 and on the platen 22. This allows an automatic correction for real time changes during film growth. Once these values are obtained, the microcontroller calculates an average value ($V_{Ave.}$) and then in order to establish a threshold value to begin counting the width of the reflection minima, the following equation may be used:

$$V_{Threshold} = (V_{Ave.} - V_{Min.}) \times S_{VT} + V_{Min.}$$

The variable $S_{VT}$ is a sensitivity factor, similar to a "tooling factor" in other instruments, with values ranging between 0 and 1, and allows the user to compensate for different sample/platen reflectivity, distance to platen 22, and detector 62 gain and noise levels. A typical value is ≈0.3. Once $V_{Threshold}$ is determined, a count is made of the number of successive measurements that satisfy $V < V_{Threshold}$. The count corresponds to the length of the web segment. Both the average count of the web width. $Web_{Ave.}$, and the longest count of the web width. $Web_{Max}$, are determined over 50 webs. In FIG. 5, the web width, i.e., length of web segment, is identified by the variable $\tau_{web}$ at or proximate to the $V_{Threshold}$ value.

An "asymmetry threshold". $A_{Threshold}$, is then calculated from:

$$A_{Threshold} = Web_{Max.} - (Web_{Max.} - Web_{Ave.}) \times S_{WT}$$

The variable $S_{WT}$ is a count width threshold sensitivity factor, again allowing the user to compensate for conditions as in the above case, e.g., to account for film growth on samples 20 and platen 22 over time. A typical value for $S_{WT}$≈0.5. When it is determined that the above threshold is satisfied, a 5 µS trigger pulse is sent out by the microcontroller. Of course, if necessary the exact duration of trigger pulse can be longer or shorter than 5 µS to suit the application. In this manner, a pulse synchronized to the rotation of the platen 22 is continually generated. In other words, the trigger pulse is generated once per evolution of the platen 22, and can be used to calculate the real-time angular position of the platen 22 or the real-time angular speed of the platen 22 or both. Additional determinations can be made as well, such as a coupling 27 slippage assessment, and other useful metrics.

In an alternative implementation, the user can input the number of samples 20 on the platen 22 (or the number of webs 58, 60). This input can then be entered into the algorithm and act as a check on the asymmetric trigger position. The check is made by setting the trigger pulse to automatically send every X successive measurements detected, where X is the number of samples 20 input (or the number of webs 58, 60). In the case of very weak reflectance signal from the samples 20 (as a result of either a strong deconstructive light interference or a very rough sample 20 surface), the algorithm may be programmed to automatically revert to outputting every X successive measurements, and thus not rely on detecting the asymmetry in wide web 60 width relative to the other narrow webs 58. In this implementation, the system will trigger properly with a symmetric platen (not shown), except that while the trigger pulse will occur in the same position for every rotation, the absolute trigger position with respect to a specific sample 20 on the platen) will not be known.

The foregoing invention has been described in accordance with the relevant legal standards, thus the description is exemplary rather than limiting in nature. Variations and modifications to the disclosed embodiment may become apparent to those skilled in the art and fall within the scope of the invention.

What is claimed is:

1. An apparatus for determining the synchronicity of a rotary platen in a vacuum deposition chamber, said apparatus comprising:
    a vacuum deposition chamber,
    a platen supported for rotation about a center axis in said vacuum deposition chamber, said platen configured to emit light signals about a circular swept path centered about said central axis, said platen including an asymmetry feature along said circular swept path, said asymmetry feature having a unique light signature with respect to other light signals emitted from said platen along said circular swept path,
    a rotary spindle drive,
    a non-positive coupling operatively connecting said rotary spindle drive to said platen for forcibly rotating said platen about said center axis,
    detector fixed relative to said rotating platen for measuring light signals emitted from said platen along said circular swept path, said detector configured to generate a unique signal in direct response to said unique light signature emitted by said asymmetry feature.

2. The apparatus of claim 1 further including a microcontroller including a non-transitory computer readable medium coded with instructions and executed by a processor to generate a trigger pulse synchronized to said unique signal, the frequency of said trigger pulse corresponding to the real-time rotational speed of said platen.

3. The apparatus of claim 1 wherein said detector generates a voltage in response to reflectivity changes in the measurement of light signals emitted from said platen along said circular swept path, further including a microcontroller including a non-transitory computer readable medium coded with instructions and executed by a processor to identify said unique signal from a prolonged decrease in the generated said voltage.

4. The apparatus of claim 1 further including a light source fixed relative to said platen for projecting a light beam onto said platen along said circular swept path, with reflected light from said light beam comprising said light signals emitted from said platen along said circular swept path.

5. The apparatus of claim 4 wherein said light source comprises a highly collimated light source.

6. The apparatus of claim 4 wherein said light source and said detector are supported on a common mounting block.

7. The apparatus of claim 6 wherein said mounting block includes a beam splitter disposed in the path of said light beam generated by said light source and said light signals emitted from said platen.

8. The apparatus of claim 1 wherein said platen includes a plurality of disc-shaped samples disposed thereon in a circular pattern generally centered about said center axis, with each segment of said platen between adjacent said disc-shaped samples comprising a web.

9. The apparatus of claim 8 wherein each of said webs intersect said circular swept path along a web segment, each said web segment having a length.

10. The apparatus of claim 9 wherein said asymmetry feature comprises one of said webs having a web segment longer in length than the length of all of the other said web segments.

11. The apparatus of claim 10 wherein each of said web segments coincide with the narrowest circumferentially measured portion of said webs.

* * * * *